United States Patent
Wada

(10) Patent No.: US 7,427,333 B2
(45) Date of Patent: Sep. 23, 2008

(54) RESIST REMOVING METHOD AND RESIST REMOVING APPARATUS

(75) Inventor: Masayuki Wada, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 11/467,316

(22) Filed: Aug. 25, 2006

(65) Prior Publication Data

US 2007/0045231 A1 Mar. 1, 2007

(30) Foreign Application Priority Data

Aug. 26, 2005 (JP) ............... 2005-246373

(51) Int. Cl.
*C23F 1/00* (2006.01)
*H01L 21/306* (2006.01)

(52) U.S. Cl. ............ 156/345.11; 156/345.15; 156/345.17; 156/345.21; 156/345.22

(58) Field of Classification Search ............ 156/345.11, 156/345.15, 345.17, 345.21, 345.22
See application file for complete search history.

(56) References Cited

U.S. PATENT DOCUMENTS

| | | | |
|---|---|---|---|
| 5,634,980 A | 6/1997 | Tomita et al. | |
| 6,726,848 B2 * | 4/2004 | Hansen et al. | 216/109 |
| 6,878,303 B2 * | 4/2005 | Okamoto | 216/93 |
| 6,979,655 B2 * | 12/2005 | Niuya et al. | 438/745 |
| 2005/0072525 A1 * | 4/2005 | Pancham et al. | 156/345.11 |
| 2005/0178401 A1 * | 8/2005 | Boyers | 134/1.3 |
| 2005/0242062 A1 * | 11/2005 | Sakurai et al. | 216/83 |

FOREIGN PATENT DOCUMENTS

| | | |
|---|---|---|
| JP | 2005-93926 | 4/2005 |
| KR | 10-0274078 | 10/1994 |
| KR | 1996-0042993 | 12/1996 |

OTHER PUBLICATIONS

Office Action issued Sep. 19, 2007 in connection with the Korean Application No. 10-2006-0079448.

* cited by examiner

*Primary Examiner*—Duy-Vu N Deo
(74) *Attorney, Agent, or Firm*—Ostrolenk, Faber, Gerb & Soffen, LLP

(57) ABSTRACT

In an inventive resist removing method, sulfuric acid and hydrogen peroxide water are supplied to a surface of a substrate to remove a resist from the substrate surface. Thereafter, hydrogen peroxide water is supplied to the substrate surface to remove the sulfuric acid from the substrate surface.

4 Claims, 3 Drawing Sheets

RESIST REMOVING METHOD AND RESIST REMOVING APPARATUS

BACKGROUND OF THE INVENTION

1. Field of the Invention

The present invention relates to a resist removing method and a resist removing apparatus for removing an unnecessary resist from a surface of any of various substrates such as semiconductor wafers.

2. Description of the Related Art

Semiconductor device production processes generally include the steps of selectively etching an oxide film and the like formed in a surface of a semiconductor wafer (hereinafter referred to simply as "wafer"), and locally implanting an impurity (ions) such as phosphorus, arsenic or boron into the surface of the wafer. In these steps, a resist pattern of an organic compound such as a photosensitive resin is formed on an outermost surface of the wafer for prevention of the etching or the ion implantation with respect to an unintendedundesired portion of the wafer, whereby the portion undesiredunintended to be subjected to the etching or the ion implantation is masked. After the etching or the ion implantation, the resist present on the wafer becomes unnecessary. Therefore, a resist removing treatment is performed for removing the unnecessary resist from the wafer after the etching or the ion implantation.

Exemplary methods for the resist removing treatment include a batch treatment method in which a plurality of substrates are treated in a batch, and a single substrate treatment method in which substrates are treated one by one. Conventionally, the batch treatment method has been predominant. However, the batch treatment method requires a treatment bath having a volume sufficiently great to accommodate the plurality of substrates. Further, the substrates to be treated tend to have an increased size. Therefore, the single substrate treatment method is attractive without the need for the greater-volume treatment bath.

In the resist removing treatment by the single substrate treatment method, an SPM (sulfuric acid/hydrogen peroxide mixture) which is a mixture of sulfuric acid and hydrogen peroxide water is supplied to a center portion of the surface of the wafer, while the wafer is rotated at a predetermined rotation speed about a rotation axis extending through the center of the wafer. The SPM supplied to the wafer surface flows from the center portion to a peripheral edge of the wafer on the wafer surface to quickly spread over the entire wafer surface by a centrifugal force generated by the rotation of the wafer. The resist present on the wafer surface is lifted and removed from the wafer surface by a strong oxidation power of Caro's acid (peroxosulfuric acid) contained in the SPM. After the removal of the resist from the wafer surface, pure water is supplied to the wafer surface to rinse away the SPM adhering to the wafer. Thereafter, the wafer is rotated at a higher speed for drying. Thus, the resist removing treatment sequence is completed.

The inventor of the present invention conducted a study in which the number of particles adhering to the wafer surface was determined by means of a particle counter immediately after the resist removing treatment, and found that virtually no particle was detected immediately after the treatment but, after a lapse of several hours from the completion of the treatment, several tens of thousands particles were detected.

SUMMARY OF THE INVENTION

It is therefore an object of the present invention to provide a resist removing method and a resist removing apparatus which ensures that a surface of a substrate is free from generation of particles detectable by the particle counter even after a lapse of time from the completion of the treatment.

A resist removing method according to one aspect of the present invention comprises the steps of: supplying sulfuric acid and hydrogen peroxide water to a surface of a substrate to remove a resist from the substrate surface; and supplying hydrogen peroxide water to the substrate surface after the sulfuric acid/hydrogen peroxide water supplying step to remove the sulfuric acid and the hydrogen peroxide water supplied in the sulfuric acid/hydrogen peroxide water supplying step from the substrate surface.

In this method, the resist present on the substrate surface is removed by supplying the sulfuric acid and the hydrogen peroxide water to the substrate surface. Thereafter, the hydrogen peroxide water is supplied to the substrate surface freed of the resist.

In the prior art method in which an SPM (a mixture of sulfuric acid and hydrogen peroxide water) is supplied to the substrate surface to remove the resist from the substrate surface and then the SPM is rinsed away from the substrate surface freed of the resist with pure water, particles detectable by the particle counter are generated on the substrate surface after a lapse of several hours from the completion of the treatment. The generation of the particles is conceivably because the sulfuric acid remains on the substrate surface after the treatment. For the removal of the resist, concentrated sulfuric acid (having a concentration of not lower than 96%) is typically used. The concentrated sulfuric acid has a higher viscosity. Therefore, even if the substrate surface is rinsed with the pure water after the removal of the resist, a part of the concentrated sulfuric acid unreacted with the hydrogen peroxide water in the SPM remains on the substrate surface. After the completion of the treatment, the remaining concentrated sulfuric acid absorbs moisture in the air to swell. As a result, particles having diameters detectable by the particle counter are generated on the substrate surface.

After the removal of the resist, the hydrogen peroxide water but not the pure water is supplied to the substrate surface, whereby the sulfuric acid adhering to the substrate surface reacts with the hydrogen peroxide water into Caro's acid ($H_2SO_4+H_2O_2 \rightarrow H_2SO_5+H_2O$). The Caro's acid has a lower viscosity (a higher fluidity) and, therefore, is easily washed away by the hydrogen peroxide water supplied to the substrate surface. Hence, there is no possibility that the sulfuric acid remains on the treated substrate surface. Thus, Eeven after a lapse of time from the completion of the treatment, the substrate surface is free from generation of particles detectable by the particle counter.

The sulfuric acid/hydrogen peroxide water supplying step preferably includes the step of supplying an SPM which is a mixture of the sulfuric acid and the hydrogen peroxide water to the substrate surface from a mixture nozzle, and the hydrogen peroxide water supplying step preferably includes the step of supplying the hydrogen peroxide water to the substrate surface from the mixture nozzle.

After the SPM is supplied to the substrate surface from the mixture nozzle in the sulfuric acid/hydrogen peroxide water supplying step, the hydrogen peroxide water is supplied to the substrate surface from the mixture nozzle in the hydrogen peroxide water supplying step. Therefore, the SPM remaining in the mixture nozzle is spouted together with the hydrogen peroxide water from the mixture nozzle immediately after the start of the hydrogen peroxide water supplying step. As the hydrogen peroxide water supplying step proceeds, the amount of the SPM contained in a liquid spouted from the mixture nozzle is reduced and, finally, only the hydrogen peroxide water is spouted from the mixture nozzle.

The SPM is prepared, for example, by mixing sulfuric acid conditioned at a higher temperature on the order of 80° C. with hydrogen peroxide water at a room temperature (about 25° C.). When the sulfuric acid reacts with the hydrogen peroxide water, a great reaction heat is generated, so that the temperature of the SPM on the substrate surface is increased to 130 to 150° C. which is higher than the temperature of the sulfuric acid. Therefore, if the pure water at a lower temperature is supplied to the substrate surface whose temperature is increased by the supply of the SPM after the completion of the supply of the SPM to the substrate surface (after the completion of the sulfuric acid/hydrogen peroxide water supplying step), the temperature of the substrate surface is steeply reduced, so that patterns and the like formed on the substrate surface is subjected to a heat shock. The heat shock is one of conceivable causes of destruction of the patterns.

In the hydrogen peroxide water supplying step, the hydrogen peroxide water is supplied to the substrate surface from the mixture nozzle. Thus, the amount of the SPM contained in the liquid spouted from the mixture nozzle is reduced at the initial stage of the hydrogen peroxide water supplying step, and the temperature of the liquid is correspondingly reduced. Therefore, the patterns and the like formed on the substrate surface is prevented from suffering from the heat shock. Therefore, the destruction of the patterns is suppressed which may otherwise occur due to the heat shock.

The sulfuric acid/hydrogen peroxide water supplying step may include the step of supplying the mixture of the sulfuric acid and the hydrogen peroxide water to the substrate surface from the mixture nozzle, and the hydrogen peroxide water supplying step may include the step of supplying the hydrogen peroxide water to the substrate surface from a hydrogen peroxide water nozzle. That is, the hydrogen peroxide water nozzle provided separately from the mixture nozzle used in the sulfuric acid/hydrogen peroxide water supplying step may be used for supplying the hydrogen peroxide water to the substrate surface.

A resist removing apparatus according to another aspect of the present invention comprises a substrate holding mechanism which holds a substrate, a sulfuric acid supplying mechanism which supplies sulfuric acid to a surface of the substrate held by the substrate holding mechanism, a hydrogen peroxide water supplying mechanism which supplies hydrogen peroxide water to the surface of the substrate held by the substrate holding mechanism, and a control unit which controls the sulfuric acid supplying mechanism and the hydrogen peroxide water supplying mechanism so that the sulfuric acid and the hydrogen peroxide water are supplied to the surface of the substrate held by the substrate holding mechanism to remove a resist from the substrate surface and then the hydrogen peroxide water is supplied to the substrate surface freed of the resist.

The resist removing apparatus is capable of performing the aforementioned resist removing method.

The resist removing apparatus preferably further comprises a mixture nozzle from which the sulfuric acid supplied from the sulfuric acid supplying mechanism and the hydrogen peroxide water supplied from the hydrogen peroxide water supplying mechanism are spouted toward the surface of the substrate held by the substrate holding mechanism. It is preferred to supply an SPM which is a mixture of the sulfuric acid and the hydrogen peroxide water to the substrate surface from the mixture nozzle to remove the resist from the substrate surface, and then supply the hydrogen peroxide water to the substrate surface from the mixture nozzle.

In this case, the amount of the sulfuric acid/hydrogen peroxide water mixture contained in a liquid spouted from the mixture nozzle is reduced at the initial stage of the step of supplying the hydrogen peroxide water to the substrate surface after the removal of the resist, and the temperature of the liquid is correspondingly reduced. Therefore, patterns and the like formed on the substrate surface are prevented from suffering from a heat shock. Hence, the destruction of the patterns is suppressed which may otherwise occur due to the heat shock.

Alternatively, the resist removing apparatus may further comprise a second hydrogen peroxide water supplying mechanism which supplies hydrogen peroxide water to the surface of the substrate held by the substrate holding mechanism, and a hydrogen peroxide water nozzle from which the hydrogen peroxide water supplied from the second hydrogen peroxide water supplying mechanism is spouted toward the surface of the substrate held by the substrate holding mechanism.

The resist removing apparatus preferably further comprises a mixing valve which mixes the sulfuric acid supplied from the sulfuric acid supplying mechanism and the hydrogen peroxide water supplied from the hydrogen peroxide water supplying mechanism to prepare the SPM. The resist removing apparatus preferably further comprises a pipe connected to the mixing valve and the mixture nozzle, and an agitation communication pipe provided in the pipe for agitating the SPM prepared by the mixing valve.

In the agitation communication pipe, the SPM is agitated, whereby a chemical reaction between the sulfuric acid and the hydrogen peroxide water is promoted. Thus, the sulfuric acid and the hydrogen peroxide water in the SPM sufficiently react with each other, whereby the SPM contains a greater amount of Caro's acid at a higher temperature.

The foregoing and other objects, features and effects of the present invention will become more apparent from the following detailed description of the preferred embodiments with reference to the attached drawings.

DETAILED DESCRIPTION OF PREFERRED EMBODIMENTS

Figure 1:
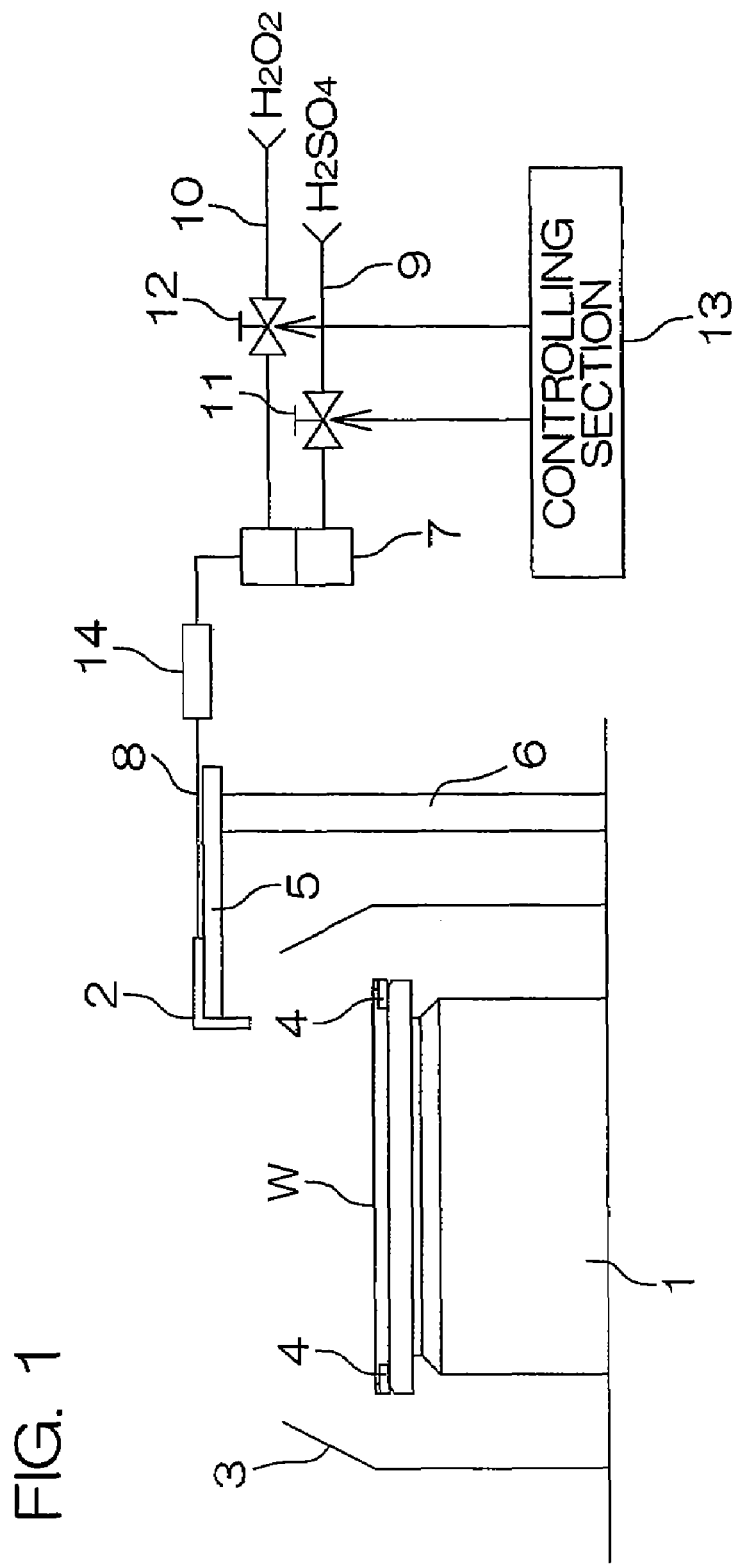
FIG. 1 is a diagram schematically illustrating the construction of a resist removing apparatus according to one embodiment of the present invention.

FIG. 1 is a diagram schematically illustrating the construction of a resist removing apparatus according to one embodiment of the present invention.

The resist removing apparatus is of a single substrate treatment type, which performs a resist removing treatment for removing a resist from a surface of a silicon semiconductor wafer W (hereinafter referred to simply as "wafer W") as an example of a substrates. The resist removing apparatus includes a spin chuck 1 for holding generally horizontally and rotating the wafer W generally horizontally and rotating the wafer W, and a nozzle 2 for supplying an SPM (a sulfuric acid/hydrogen peroxide mixture which is a mixture of sulfuric acid and hydrogen peroxide water) to a surface of the wafer W held by the spin chuck 1, and a container-like cup 3 which accommodates the spin chuck 1 for receiving the SPM and the like flowing down or scattered from the wafer W.

The spin chuck 1 holds the wafer W generally horizontally, for example, by holding the wafer W by a plurality of holder members 4. Further, the spin chuck 1 rotates the wafer W held thereby about a generally vertical axis. Thus, the wafer W is rotated while being held generally horizontally.

The construction of the spin chuck 1 is not limited to that described above, but a vacuum chuck such as of a vacuum suction type may be employed. The vacuum chuck holds the wafer W generally horizontally by vacuum-sucking a lower surface of the wafer W. The vacuum chuck rotates the wafer held thereby about a generally vertical axis. Thus, the wafer W is rotated while being held generally horizontally.

The nozzle 2 is attached to a distal end of an arm 5 provided above the spin chuck 1. The arm 5 is supported by a support shaft 6 extending generally vertically on a lateral side of the cup 3, and extends generally horizontally from an upper end of the support shaft 6. The support shaft 6 is rotatable about its center axis. By rotating the support shaft 6, the nozzle 2 is located above the wafer W held by the spin chuck 1 or located at a standby position defined outside the cutp 3. By reciprocally rotating the support shaft 6 within a predetermined angular range, the arm 5 is pivoted above the wafer W held by the spin chuck 1. By the pivoting of the arm 5, an SPM supplying position at which the SPM is supplied from the nozzle 2 is scanned (moved) over on the surface of the wafer W held by the spin chuck 1.

The nozzle 2 is connected to an end of an SPM supply pipe 8 extending from a mixing valve 7.

A sulfuric acid supply pipe 9 and a hydrogen peroxide water supply pipe 10 are connected to the mixing valve 7. Sulfuric acid conditioned at a predetermined temperature (e.g., not lower than 80° C.) is supplied to the sulfuric acid supply pipe 9 from a sulfuric acid supply source not shown. A sulfuric acid valve 11 is provided in the sulfuric acid supply pipe 9 for controlling the supply and stop of the sulfuric acid to the mixing valve 7. Hydrogen peroxide water at a room temperature (about 25° C.) is supplied to the hydrogen peroxide water supply pipe 10 from a hydrogen peroxide water supply source not shown. A hydrogen peroxide water valve 12 is provided in the hydrogen peroxide water supply pipe 10 for controlling the supply and stop of the hydrogen peroxide water to the mixing valve 7.

The opening and closing of the sulfuric acid valve 11 and the hydrogen peroxide water valve 12 is controlled by a controlling section 13 including a microprocessor. When the sulfuric acid valve 11 and the hydrogen peroxide water valve 12 are opened by the control of the controlling section 13, the sulfuric acid supplied to the sulfuric acid supply pipe 9 and the hydrogen peroxide water supplied to the hydrogen peroxide water supply pipe 10 flow into the mixing valve 7 and mixed, for example, in a mixing ratio (flow rate ratio) of (sulfuric acid):(hydrogen peroxide water)=1:0.5. When the sulfuric acid and the hydrogen peroxide water are mixed, a chemical reaction between the sulfuric acid and the hydrogen peroxide water occurs ($H_2SO_4 + H_2O_2 \rightarrow H_2SO_5 + H_2O$). By a reaction heat generated at this time, the temperature of the sulfuric acid/hydrogen peroxide water mixture (SPM) is increased to a temperature not lower than the temperature of the sulfuric acid. When only the hydrogen peroxide water valve 12 is opened with the sulfuric acid valve 11 being closed, only the hydrogen peroxide water is supplied to the mixing valve 7 from the hydrogen peroxide water supply pipe 10.

An agitation communication pipe 14 is provided in the SPM supply pipe 8 for agitating the sulfuric acid/hydrogen peroxide water mixture flowing from the mixing valve 7.

The agitation communication pipe 14 has a construction such that a plurality of agitation fins each having a rectangular plate shape twisted about 180 degrees about a liquid flow direction are disposed in a pipe in a 90-degree angularly offset relation of rotation angles about a center axis of the pipe extending in the liquid flow direction. An example of the agitation communication pipe 14 is an inline mixer available under the trade name of "MX-Series Inline Mixer" from Noritake Company Co. Limited and Advance Electric Industry Co. Inc.ompany Limited.

In the agitation communication pipe 14, the SPM is agitated, whereby the chemical reaction between the sulfuric acid and the hydrogen peroxide water in the SPM is promoted. Thus, the sulfuric acid and the hydrogen peroxide water sufficiently react with each other to generate a greater amount of Caro's acid ($H_2SO_5$:peroxosulfuric acid). Further, the temperature of the SPM is increased to a higher level. The SPM containing the greater amount of Caro's acid at a higher temperature is supplied to the nozzle 2 from the agitation communication pipe 14 through the SPM supply pipe 8, and further supplied to the surface (upper surface) of the wafer W held by the spin chuck 1 from the nozzle 2. Even after passage of the SPM passes through the agitation communication pipe 14, the temperature of the SPM is further increased to reach 130 to 150° C. on the surface of the wafer W.

Figure 2:
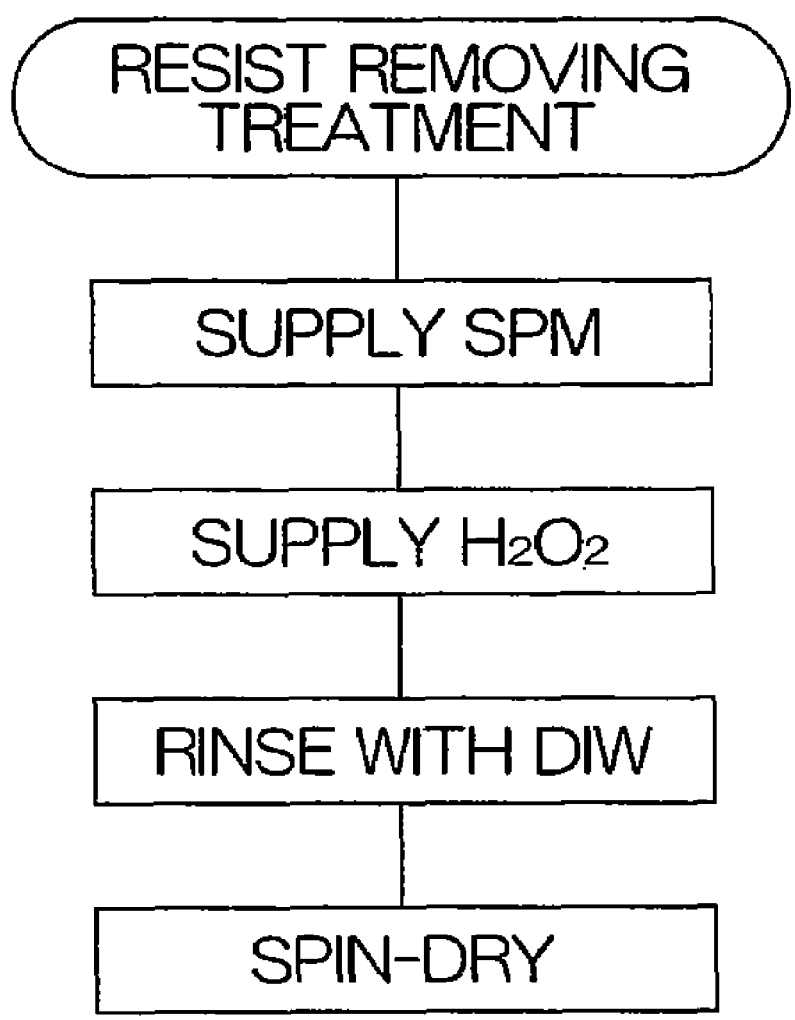
FIG. 2 is a diagram for explaining a resist removing treatment to be performed by the resist removing apparatus shown in FIG. 1.

FIG. 2 is a diagram for explaining the resist removing treatment to be performed by the resist removing apparatus.

For the resist removing treatment, a wafer W is loaded into the resist removing apparatus by a transport robot (not shown). The wafer W is transferred from the transport robot to the spin chuck 1 and held by the spin chuck 1 with its front surface upward.

When the wafer W is held by the spin chuck 1, the rotation of the wafer W by the spin chuck 1 is started, whereby the wafer W is rotated at a predetermined rotation speed (e.g., 800 rpm). Further, the arm 5 is pivoted to a position above the wafer W held by the spin chuck 1 from the standby position defined outside the cup 3. Then, the sulfuric acid valve 11 and the hydrogen peroxide valve 12 are opened to supply the SPM to the surface of the wafer W from the nozzle 2 (SPM supplying step).

While the SPM is supplied to the surface of the wafer W from the nozzle 2, the arm 5 is repeatedly pivoted within the predetermined angular range. By the pivoting of the arm 5, the SPM supplying position on the surface of the wafer W is repeatedly scanned along an arcuate path extending from the rotation center of the wafer W to a peripheral edge of the wafer W. The SPM supplied to the surface of the wafer W flows from the supply position to the peripheral edge of the wafer W to spread over the surface of the wafer W by a centrifugal force generated by the rotation of the wafer W. Thus, the SPM evenly spreads over the entire surface of the wafer W, whereby a resist present on the surface of the wafer W is lifted off by a strong oxidation power of the Caro's acid contained in the SPM and is removed.

After a lapse of a predetermined period (e.g., 60 seconds) from the start of the supply of the SPM, only the sulfuric acid valve 11 is closed with the hydrogen peroxide valve 12 kept open. Thus, only the hydrogen peroxide water from the hydrogen peroxide water supply pipe 10 is supplied to the mixing valve 7. The hydrogen peroxide water causes the SPM remaining in the mixing valve 7, the SPM supply pipe 8 and the agitation communication pipe 14 to flow into the nozzle 2. Therefore, the SPM remaining in the mixing valve 7, the SPM supply pipe 8, the agitation communication pipe 14 and the nozzle 2 is spouted together with the hydrogen peroxide water supplied from the hydrogen peroxide water supply pipe 10 through the nozzle 2 immediately after the closing of the sulfuric acid valve 11. As this hydrogen peroxide water supplying step ($H_2O_2$ supply step) proceeds, the amount of the SPM contained in a liquid spouted from the nozzle 2 is reduced. After a lapse of about 5 seconds from the closing of the sulfuric acid valve 11, only the hydrogen peroxide water is finally spouted from the nozzle 2.

In the hydrogen peroxide water supplying step, the rotation of the wafer W by the spin chuck 1 and the pivoting of the arm 5 are continued. Therefore, the hydrogen peroxide water supply position on the surface of the wafer W is repeatedly scanned along an arcuate path extending from the rotation center of the wafer W to the peripheral edge of the wafer W. Then, the hydrogen peroxide water supplied to the surface of the wafer W flows from the supply position to the peripheral edge of the wafer W to spread over the surface of the wafer W by the centrifugal force generated by the rotation of the wafer W. Thus, the hydrogen peroxide water evenly spreads over the entire surface of the wafer W, whereby the SPM adhering to the surface of the wafer W is replaced with the hydrogen peroxide water.

When the SPM is removed from the surface of the wafer W after a lapse of a predetermined period (e.g., 10 seconds) from the closing of the sulfuric acid valve 11, the hydrogen peroxide water valve 12 is closed to stop the supply of the hydrogen peroxide water to the surface of the wafer W from the nozzle 2. Then, the arm 5 is pivoted back to the standby position defined outside the cup 3.

Thereafter, the rotation of the wafer W is continued, and DIW (deionized water) is supplied to the surface of the rotated wafer W. The DIW supplied onto the surface of the wafer W flows from the center of the wafer W to the peripheral edge of the wafer W over the surface of the wafer W by a centrifugal force generated by the rotation of the wafer W. Thus, the DIW spreads over the entire surface of the wafer W, whereby the hydrogen peroxide water adhering to the surface of the wafer W is rinsed away with the DIW (DIW rinsing step).

The supply of the DIW to the surface of the wafer W is continued for a predetermined period (e.g., 30.5 seconds), and stopped. Then, the rotation speed of the wafer W rotated by the spin chuck 1 is increased to a higher level (e.g., 2500 rpm). Thus, the DIW adhering to the wafer W is span off by a centrifugal force, so that the wafer W is dried. After a lapse of a predetermined period (e.g., 2.5 seconds) from the increase of the rotation speed of the wafer W, the rotation of the wafer W by the spin chuck 1 is stopped. Thereafter, the wafer W thus treated is unloaded by the transport robot.

In this embodiment, as described above, the SPM is supplied onto the wafer W, whereby the resist present on the surface of the wafer W is removed. Thereafter, the hydrogen peroxide water is supplied to the wafer W freed of the resist.

After the removal of the resist from the surface of the wafer W, the hydrogen peroxide water but not pure water is supplied to the surface of the wafer W, whereby the sulfuric acid adhering to the surface of the wafer W chemically reacts with the hydrogen peroxide water into the Caro's acid which has a lower viscosity (a higher fluidity) than the sulfuric acid. The Caro's acid is easily washed away by the hydrogen peroxide water thereby to be removed from the surface of the wafer W. Hence, there is no possibility that the sulfuric acid remains on the surface of the treated wafer W. Therefore, the surface of the wafer W is free from particles detectable by a particle counter even after a lapse of time from the completion of the treatment.

Immediately after the start of the hydrogen peroxide water supplying step, the SPM remaining in the mixing valve 7, the SPM supply pipe 8, the agitation communication pipe 14 and the nozzle 2 is spouted together with the hydrogen peroxide water supplied from the hydrogen peroxide water supply pipe 10 through the nozzle 2. As the hydrogen peroxide water supplying step proceeds, the amount of the SPM contained in the liquid spouted from the nozzle 2 is reduced, and the temperature of the liquid spouted from the nozzle 2 is correspondingly reduced. This prevents sudden change of the surface temperature of the wafer W, whereby patterns and the like formed on the surface of the wafer W are prevented from suffering from a heat shock. Therefore, destruction of the patterns is suppressed which may otherwise occur due to the heat shock.

Figure 3:
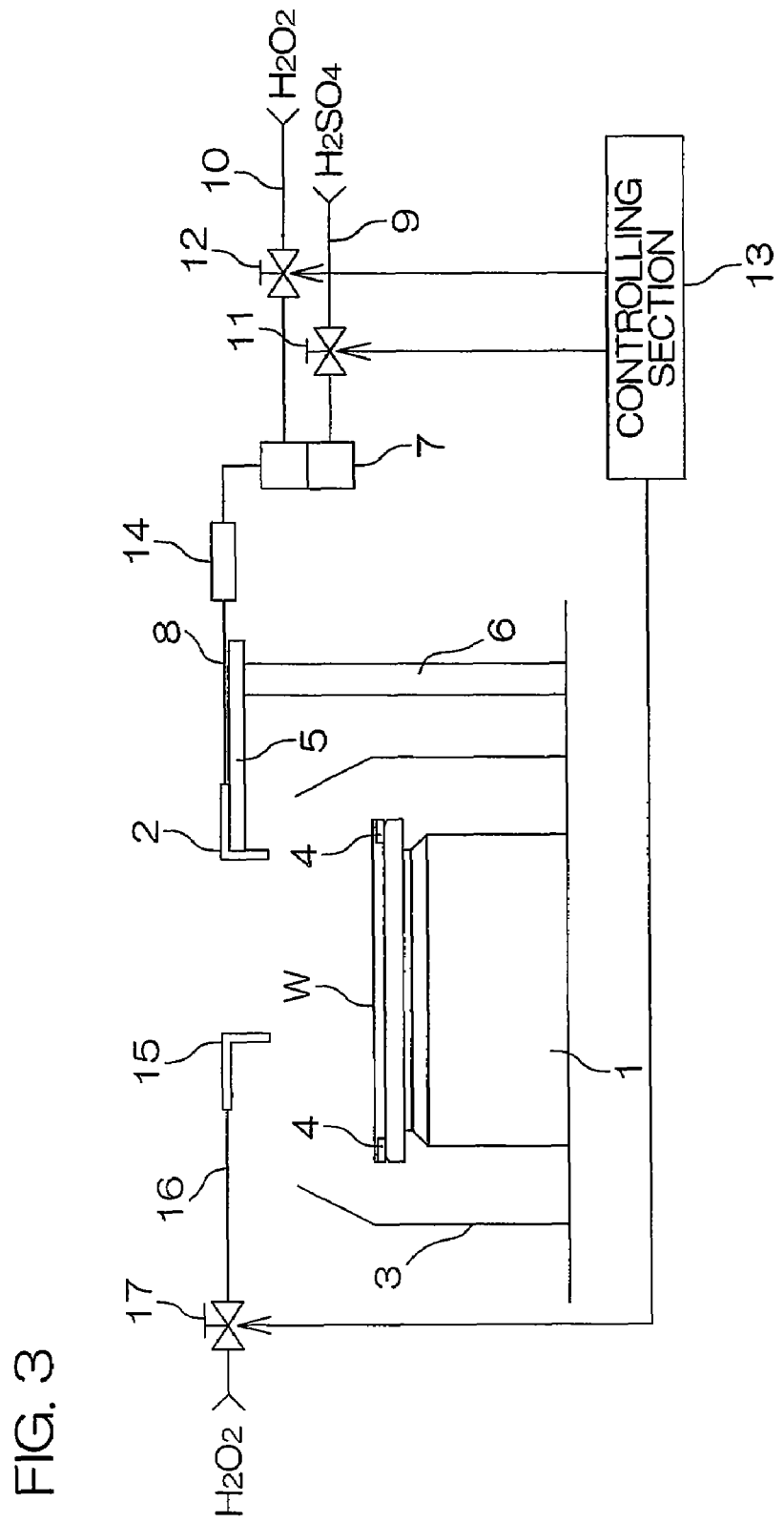
FIG. 3 is a diagram schematically illustrating the construction of a resist removing apparatus (including a nozzle for supplying hydrogen peroxide water) according to another embodiment of the present invention.

In the hydrogen peroxide water supplying step, the hydrogen peroxide water to be supplied to the surface of the wafer W is preferably spouted from the nozzle 2, because the heat shock to be caused by the supply of the hydrogen peroxide water to the wafer surface is alleviated. However, a hydrogen peroxide nozzle 15 may be provided separately from the nozzle 2, as shown in FIG. 3, for supplying the hydrogen peroxide water to the surface of the wafer W from the hydrogen peroxide water nozzle 15. In this case, a valve 17 is provided in a pipe 16 for supplying the hydrogen peroxide water to the hydrogen peroxide water nozzle 15, and the opening and closing of the valve 17 is controlled by the controlling section 13.

In the embodiment described above, the wafer W as one example of the substrate is treated, but the substrate to be treated is not limited to the wafer W. Other examples of the substrate include glass substrates for liquid crystal display devices, glass substrates for plasma display devices, glass substrates for FED (field emission display) devices, substrates for optical disks, substrates for magnetic disks, substrates for magnetic optical disks and substrates for photo masks.

While the present invention has thus been described in detail by way of the embodiment thereof, it should be understood that the embodiment is merely illustrative of the technical principles of the present invention but not limitative of the invention. The spirit and scope of the present invention are to be limited only by the appended claims.

This application corresponds to Japanese Patent Application No. 2005-246373 filed in the Japanese Patent Office on Aug. 26, 2005, the disclosure of which is incorporated herein by reference.

DESCRIPTION OF REFERENCE CHARACTERS

1: Spin chuck
2: Nozzle
9: Sulfuric acid supply pipe
10: Hydrogen peroxide water supply pipe
11: Sulfuric acid valve
12: Hydrogen peroxide water valve
13: Controlling section
14: Agitation communication pipe
15: Hydrogen peroxide water nozzle
16: Pipe
17: Valve
W: Wafer

What is claimed is:

1. A resist removing apparatus comprising:

a substrate holding mechanism for holding a substrate;

a sulfuric acid supplying mechanism which supplies sulfuric acid to a surface of the substrate held by the substrate holding mechanism;

a hydrogen peroxide water supplying mechanism which supplies hydrogen peroxide water to the surface of the substrate held by the substrate holding mechanism;

a mixture nozzle, from which the sulfuric acid supplied from the sulfuric acid supplying mechanism and the hydrogen peroxide water supplied from the hydrogen peroxide water supplying mechanism are spouted toward the surface of the substrate held by the substrate holding mechanism;

a pipe connected to the mixture nozzle;

an agitation communication pipe provided in the pipe for agitating the sulfuric acid supplied from the sulfuric acid supplying mechanism and the hydrogen peroxide water supplied from the hydrogen peroxide water supplying mechanism; and a control unit which controls the sulfuric acid supplying mechanism and the hydrogen peroxide water supplying mechanism so that the sulfuric acid and the hydrogen peroxide water are supplied to the surface of the substrate held by the substrate holding mechanism to remove a resist from the substrate surface, and then the hydrogen peroxide water is supplied to the substrate surface freed of the resist.

2. A resist removing apparatus as set forth in claim 1, further comprising a mixing valve connected to the pipe, which mixes the sulfuric acid supplied from the sulfuric acid supplying mechanism and the hydrogen peroxide water supplied from the hydrogen peroxide water supplying mechanism to prepare a mixture of the sulfuric acid and the hydrogen peroxide water.

3. A resist removing apparatus as set forth in claim 1, further comprising:

a second hydrogen peroxide water supplying mechanism which supplies hydrogen peroxide water to the surface of the substrate held by the substrate holding mechanism; and a hydrogen peroxide water nozzle from which the hydrogen peroxide water supplied from the second hydrogen peroxide water supplying mechanism is spouted toward the surface of the substrate held by the substrate holding mechanism.

4. A resist moving apparatus comprising:

a substrate holding mechanism which holds a substrate;

a sulfuric acid supplying mechanism which supplies sulfuric acid to a surface of the substrate held by the substrate holding mechanism;

a hydrogen peroxide water supplying mechanism which supplies hydrogen peroxide water to the surface of the substrate held by the substrate holding mechanism;

a mixture nozzle, from which the sulfuric acid supplied from the sulfuric acid supplying mechanism and the hydrogen peroxide water supplied from the hydrogen peroxide water supplying mechanism are spouted toward the surface of the substrate held by the substrate holding mechanism;

a pipe connected to the mixture nozzle;

an agitation communication pipe provided in the pipe for agitating the sulfuric acid supplied from the sulfuric acid supplying mechanism and the hydrogen peroxide water supplied from the hydrogen peroxide water supplying mechanism; and a control unit which controls the sulfuric acid supplying mechanism and the hydrogen peroxide water supplying mechanism so that the sulfuric acid and the hydrogen peroxide water are supplied to the surface of the substrate held by the substrate holding mechanism to remove a resist from the substrate surface.

* * * * *